United States Patent
Lakos

[11] Patent Number: 6,167,555
[45] Date of Patent: Dec. 26, 2000

[54] SYSTEM AND METHOD FOR CONVERTING POLYGON-BASED WIRES OF AN INTEGRATED CIRCUIT DESIGN TO PATH-BASED WIRES

[75] Inventor: John Stuart Lakos, Basking Ridge, N.J.

[73] Assignee: Mentor Graphics Corporation, Wilsonville, Oreg.

[21] Appl. No.: 08/943,666

[22] Filed: Oct. 3, 1997

Related U.S. Application Data

[60] Provisional application No. 60/027,768, Oct. 4, 1996.

[51] Int. Cl.$^7$ ................................................. G06F 17/50
[52] U.S. Cl. .................................................................. 716/3
[58] Field of Search ......................... 395/500.02–500.19; 716/1–21

[56] References Cited

U.S. PATENT DOCUMENTS

| | | | |
|---|---|---|---|
| 4,613,941 | 9/1986 | Smith et al. | 716/12 |
| 5,299,139 | 3/1994 | Baisuck et al. | 716/5 |
| 5,416,722 | 5/1995 | Edwards | 716/2 |
| 5,515,293 | 5/1996 | Edwards | 716/11 |
| 5,610,832 | 3/1997 | Wikle et al. | 716/11 |
| 5,612,893 | 3/1997 | Hao et al. | 716/2 |
| 5,618,744 | 4/1997 | Suzuki et al. | 438/599 |
| 5,621,653 | 4/1997 | Yuzawa | 716/3 |
| 5,625,568 | 4/1997 | Edwards et al. | 716/2 |
| 5,636,125 | 6/1997 | Rostoker et al. | 700/121 |

(List continued on next page.)

FOREIGN PATENT DOCUMENTS

| | | | |
|---|---|---|---|
| 408235225A | 9/1996 | Japan | G06F 17/50 |
| 409185644A | 7/1997 | Japan | G06F 17/50 |
| 410269267A | 10/1998 | Japan | G03F 17/50 |

OTHER PUBLICATIONS

PTO 99–4173 (Translation of Korean Article written by Moon et al., "Circuit and Symbolic Extraction from VLSI Layouts of Arbitrary Shape" Journal of the Korean Institute of Telematics and Electronics, vol. 294, No. 1, pp. 48–59, Jan. 1, 1992, Transla, Jul. 1999.

Jennings ("ICDS: a symbolic layout and mask verification system for VLSI", IEEE Proceedings of the 1980 Custom Integrated Circuits Conference, Jan. 1, 1980, pp. 101–102).

Moon et al. ("Circuit and Symbolic Extraction from VLSI Layouts of Arbitrary Shape", Journal of the Korean Institute of Telematics and Electronics, vol. 294, No. 1, pp. 48–59, Jan. 1, 1992).

Weste ("Mulga—An Interactive Symbolic Layout System for the Design of Integrated Circuits", The Bell System Technical Journal, vol. 60, No. 6, Jul. 1981, pp. 823–857).

Posluszny ("SLS: An Advanced Symbolic Layout System for Bipolar and FET Design", IEEE Transactions on Computer–Aided Design, vol. CAD–5, No. 4, Oct. 1986, pp. 450–458).

(List continued on next page.)

*Primary Examiner*—Paul R. Lintz
*Assistant Examiner*—Phallaka Kik
*Attorney, Agent, or Firm*—Klarquist Sparkman Campbell Leigh & Whinston LLP

[57] ABSTRACT

A system and method is disclosed for converting a polygon-based wire in an integrated circuit to an object-based wire element. In one aspect of the invention, a recognition engine attempts to recognize polygonal wires in response to a wire recognition statement. First, a polygon is located and analyzed. A path having a centerline and a width is deduced from the analysis of the polygon. The path is converted into a candidate polygon that is compared with the current polygon. If the candidate polygon is substantially similar (i.e., identity is not required) to the current polygon, then the path is used to configure an object-based wire element. The geometries of the object-based wire element are then compared to corresponding geometries in a support view. If the geometries of the layers of the wire element are entirely contained within the geometries on the respective layers of the support view, then the wire element is considered recognized. The wire element is then added to a recognized view.

37 Claims, 11 Drawing Sheets

U.S. PATENT DOCUMENTS

| | | | |
|---|---|---|---|
| 5,689,433 | 11/1997 | Edwards | 716/2 |
| 5,764,530 | 6/1998 | Yokomaku | 716/12 |
| 5,828,580 | 10/1998 | Ho | 716/12 |
| 5,949,986 | 9/1999 | Riley et al. | 716/2 |
| 6,035,111 | 3/2000 | Suzuki et al. | 716/11 |

OTHER PUBLICATIONS

Lin et al. ("A circuit disassembly technique for synthesizing symbolic layouts from mask descriptions", IEEE Transactions on Computer–Aided Design of Integrated Circuits and Systems, vol. 9, No. 9, Sep. 1990, pp. 959–969).

U.S. Patent Application No. 08/943,395 having a title System and Method for Converting a Polygon–Based Layout of an Integrated Circuit Design to an Object–Based Layout, filed Oct. 3, 1997.

Lin et al., "A Circuit Disassembly Technique for Synthesizing Symbolic Layouts from Mask Descriptions," *IEEE Transactions on Computer–Aided Design,* 9:9, 959–969 (Sep. 1990).

Sawada, "A Hierarchical Circuit Extractor Based on New Cell Overlap Analysis," *IEEE,* pp. 240–243 (1990).

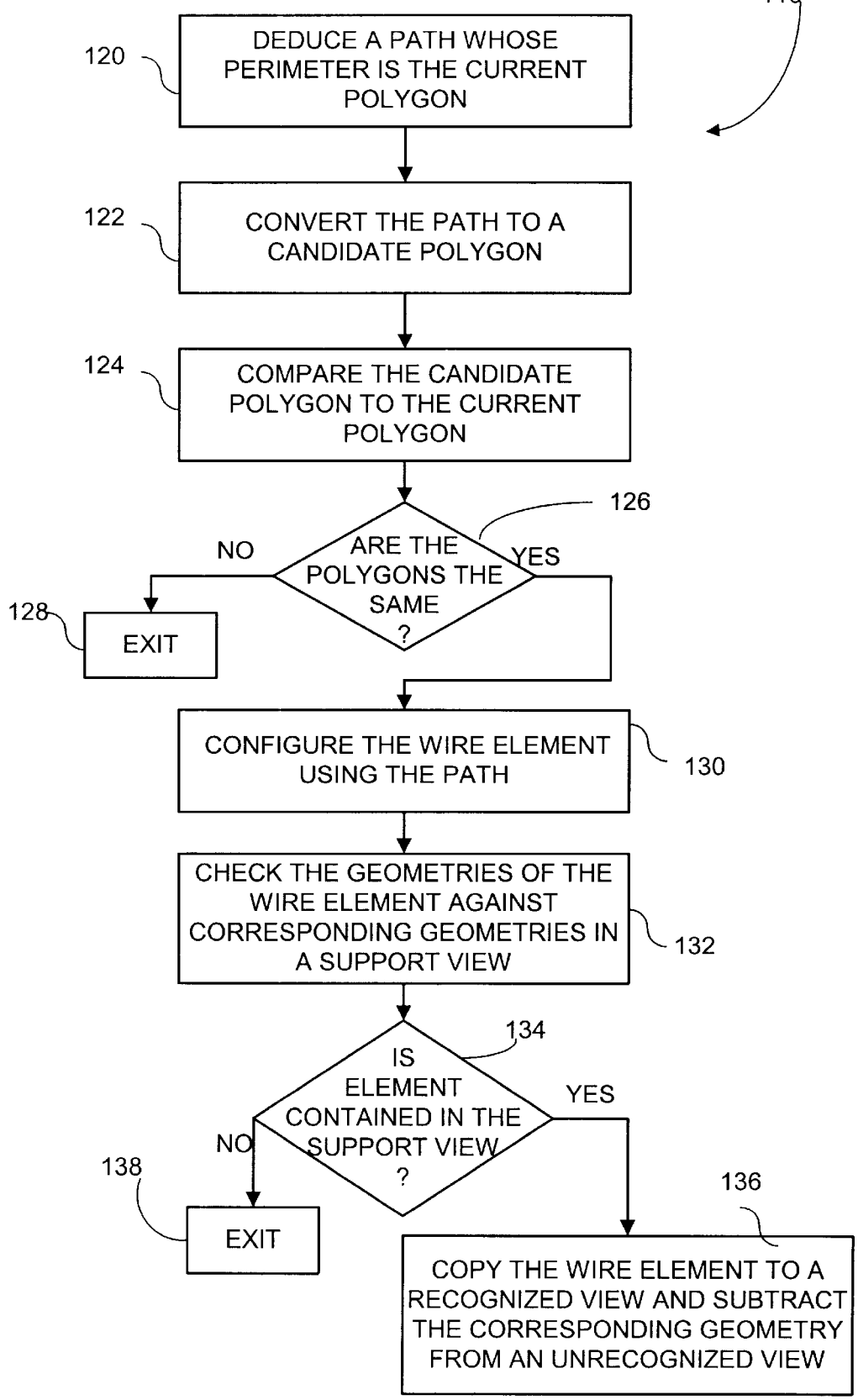

SYSTEM AND METHOD FOR CONVERTING POLYGON-BASED WIRES OF AN INTEGRATED CIRCUIT DESIGN TO PATH-BASED WIRES

This application claims the benefit of U.S. Provisional Application No. 60/027,768 filed on Oct. 4, 1996.

FIELD OF THE INVENTION

This invention relates generally to integrated circuits and, more particularly, to a recognition device for converting polygon-based wires of an integrated circuit to path-based wires.

BACKGROUND OF THE INVENTION

Integrated circuits (ICs) are designed today with computers using computer programs known as IC design tools. With these tools, a circuit designer enters geometrical shapes (e.g., polygons) of an IC design into a computer and manipulates the shapes to produce a simulated layout of the circuit. The geometrical shapes form circuit elements, such as transistors, resistors, capacitors, and wires. These shapes represent material in an IC on a physical layer (e.g., metal, diffusion, or polysilicon) with each material typically shown in a different color. From this simulated layout, the design tool generates data for producing photolithographic masks that are then used for fabricating the IC.

FIG. 1A shows an example of a transistor 10 represented as several overlapping polygons. The transistor includes a polysilicon layer 12 that forms a gate region 15 (shown generally in dashed lines) and a diffusion layer 14 that forms a source and drain of the transistor 10. The electronics industry has amassed a large inventory of IC designs that include polygon-based elements, such as the transistor 10. More recently, the industry is moving away from polygon-based layouts in favor of object-based layouts. An object-based layout represents circuit elements as objects, which are containers encapsulating the geometric properties of the circuit elements for each layer in the IC. Object-based layouts are preferable because related geometries on multiple layers can be grouped together into a single cohesive unit enabling devices to be manipulated at a higher level of abstraction than equivalent polygon-based layouts. Additionally, generating a netlist (i.e., a representation of a design as a list of electrical devices and their interconnections, but with limited geometrical information) is explicit in the object-based layout, rather than requiring an extraction process as in a polygon-based layout.

Recognition devices have been developed to convert the existing polygon-based layouts to object-based layouts. Current recognition devices, however, do not allow for converting wires in polygonal form to path-based wire elements that have a centerline and a width. An example of a wire 16 in polygonal form is shown in FIG. 1B. The wire 16 is defined by its perimeter indicated by vertices V0–V7. FIG. 1C shows the same wire 16 in a path-based form. The wire 16 is an object having attributes of a centerline 24 (shown in dashed lines) and a width. Four vertices V0–V3 define the centerline. Efficiently converting wires from polygonal to path-based form has not heretofore been achieved.

FIGS. 2A and 2B show a further example of difficulties that may occur when converting a polygonal wire to a path-based wire. FIG. 2A shows a wire 26 that has device geometries 28, 30, 32, and 34 overlapping the wire. During the recognition process, the device geometries are removed leaving a damaged wire 26 shown in FIG. 2B. There are four common types of wire damage: (1) Removal of device geometry 28 that eclipses an interior portion 36 of the wire; (2) Removal of device geometry 30 that eclipses an edge 38 of the wire; (3) Removal of device geometry 32 that eclipses a corner 40 of the wire; and (4) removal of device geometry 34 that eclipses an end 42 of the wire. Other types of wire damage may also exist.

Accordingly, it is desirable to provide a recognition device for converting polygon-based wires to a path-based wires. It is also desirable to provide such a recognition device that detects and repairs damaged wire geometries.

SUMMARY OF THE INVENTION

The present invention provides a system and method for converting a polygon-based wire to a path-based wire. The present invention also provides a method for repairing wires that are damaged as the result of removing recognized device geometries.

In one aspect of the invention, a recognition engine attempts to recognize polygonal wires in response to a wire recognition statement. First, a polygon is located and analyzed. A path having a centerline and a width is deduced from the analysis of the polygon. The path is converted into a candidate polygon that is matched against the current polygon. If the candidate polygon is substantially similar (i.e., identity is not required) to the current polygon, then the path is used to configure an object-based wire element. The geometries of the object-based wire element are then compared to corresponding geometries in a support view. If the geometries of the layers of the wire element are entirely contained within the geometries on the respective layers of the support view, then the wire element is considered recognized. The wire element is then added to a recognized view.

The foregoing and other objects, features, and advantages of the invention will become more apparent from the following detailed description a preferred embodiment which proceeds with reference to the following drawings.

BRIEF DESCRIPTION OF THE DRAWINGS

FIG. 8 is a detailed flow diagram for converting a polygonal wire to a path-based wire.

DETAILED DESCRIPTION OF A PREFERRED EMBODIMENT

Figure 3:
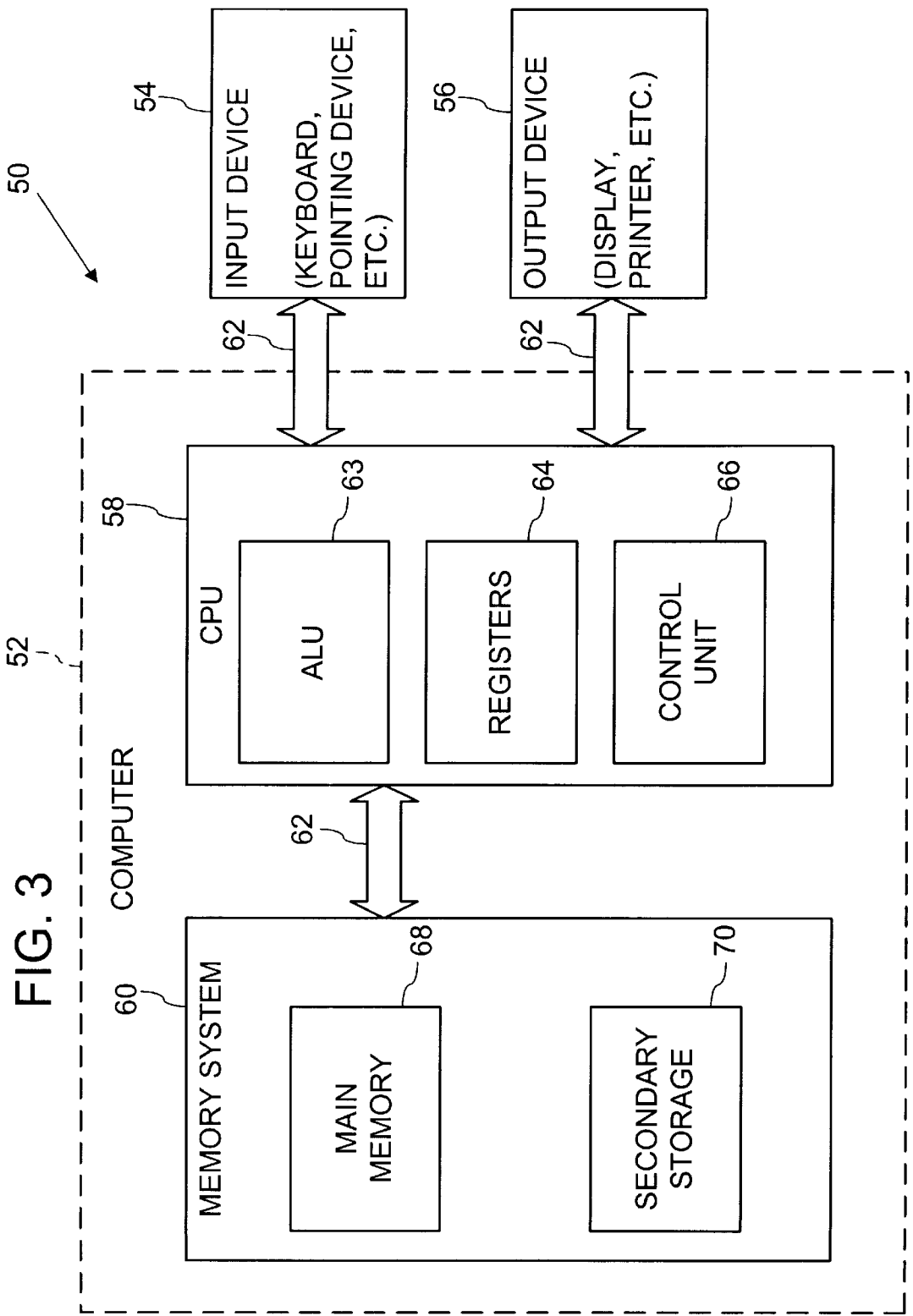
FIG. 3 is a block diagram of a computer system used to convert a polygon-based layout to an object-based layout according to the invention.

FIG. 3 is a block diagram of a computer system 50 that is used to convert a polygon-based layout of an IC design to an object-based layout embodying the invention. Computer system 50 includes as its basic element a computer 52, input device 54 and output device 56.

Computer 52 generally includes a central processing unit (CPU) 58 and a memory system 60 that communicate through a bus structure 62. CPU 58 includes an arithmetic logic unit (ALU) 63 for performing computations, registers 64 for temporary storage of data and instructions and a control unit 66 for controlling the operation of computer system 50 in response to instructions from a computer program such as an application or an operating system.

Memory system 60 generally includes high-speed main memory 68 in the form of a medium such as random access memory (RAM) and read only memory (ROM) semiconductor devices and secondary storage 70 in the form of a medium such as floppy disks, hard disks, tape, CD-ROM, etc. and other devices that use, for example, optical or magnetic recording material. Main memory 68 stores programs such as a computer's operating system and currently running application programs. Main memory 68 also includes video display memory for displaying images through a display output device 56.

Input device 54 and output device 56 are typically peripheral devices connected by bus structure 62 to computer 52. Input device 54 may include one or more of a keyboard, modem, pointing device, pen, or other device or combination of devices for providing input data to the computer, Output device 56 may be a display device, printer, modem, sound device or other device for providing output data from the computer. The input and output devices may be physically combined into a single device if desired.

It should be understood that FIG. 3 is a block diagram illustrating the basic elements of a computer system 50; the figure is not intended to illustrate a specific architecture for a computer system 50. For example, no particular bus structure is shown because various bus structures known in the field of computer design may be used to interconnect the elements of the computer system in a number of ways, as desired. CPU 58 may be comprised of a discrete ALU 63, registers 64, and control unit 66, or may be a single device in which these parts of the CPU are integrated together, such as in a microprocessor. Moreover, the number and arrangement of the elements of the computer system may vary from what is shown and described in ways known in the art (i.e., multiple CPUs, client-server systems, computer networking, etc.). A specific example of a computer that may be used is a Sun SPARC station 20.

Figure 4A:
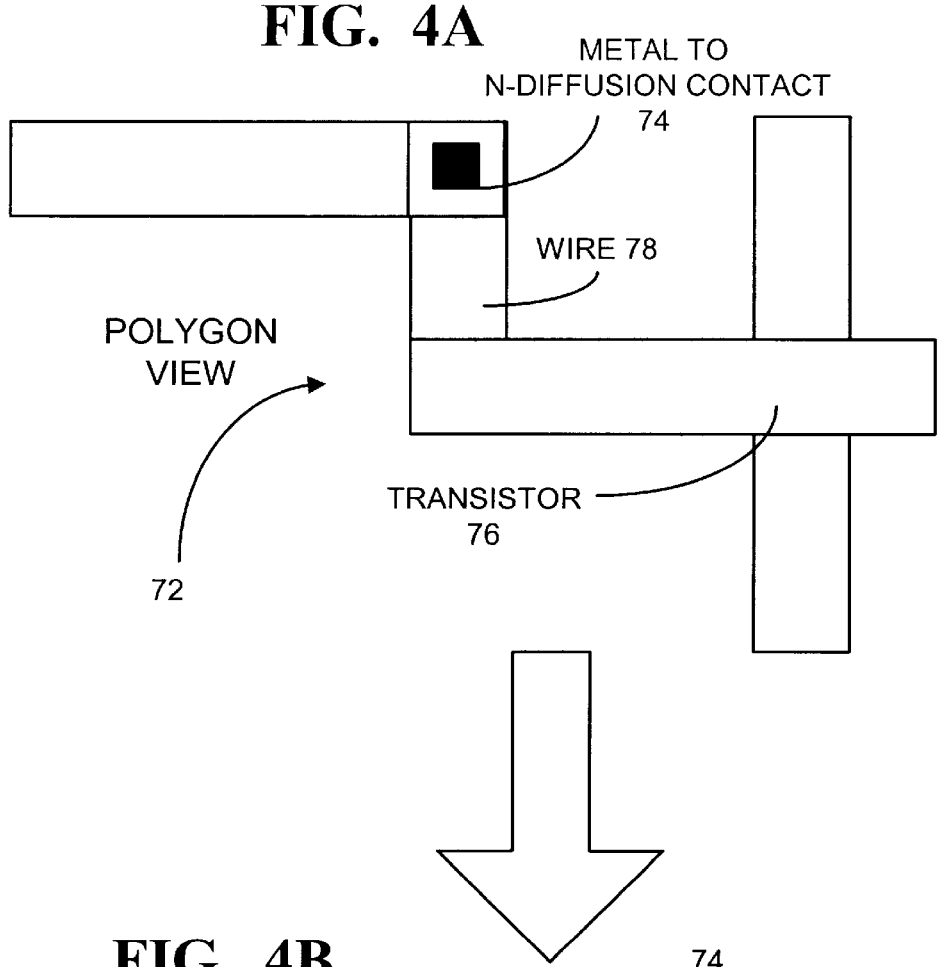
FIGS. 4A and 4B show an example of a conversion from a polygon-based layout to an object-based layout using the computer system of FIG. 3.
Figure 4B:
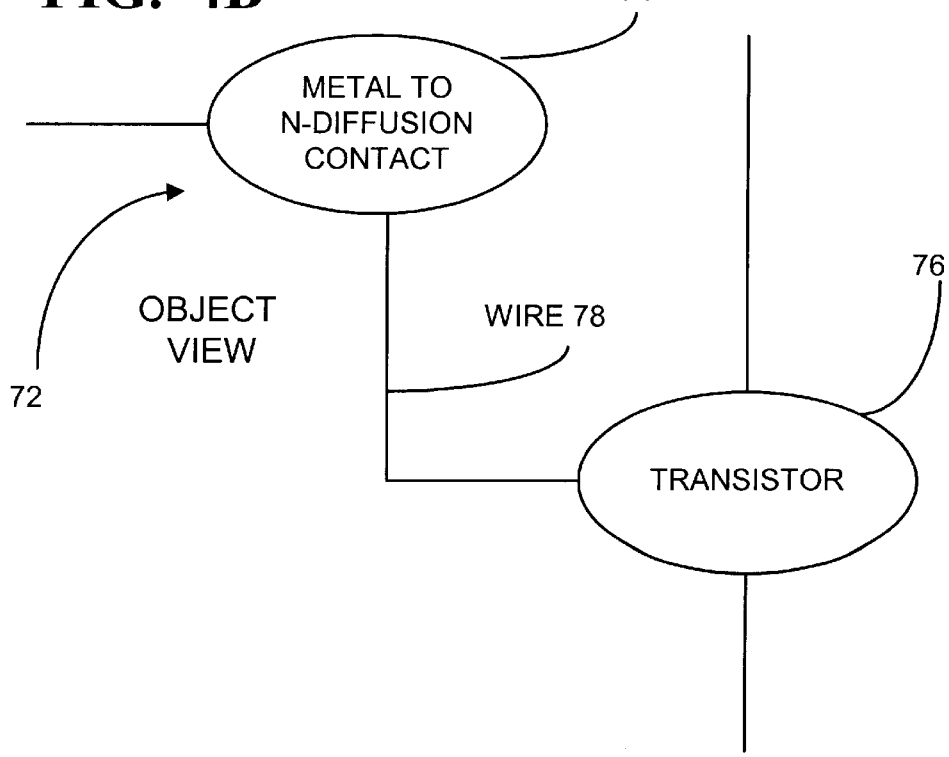

FIG. 4A shows a polygon-based view of a circuit fragment 72 including a contact 74 (called MNDIFF) between a metal layer and an N-diffusion layer, a transistor 76, and a wire 78 coupling the contact 74 and the transistor 76 together. FIG. 4B shows the equivalent circuit fragment 72 in an object view according to the illustrated embodiment of the invention. The polygon-view is typically in a Graphical Design System (GDS) format, such as GDSII, but the invention is equally applicable to other polygonal data formats. Each element and wire configuration in the polygon view is mapped to an electrically equivalent object (shown symbolically) to obtain the object view of FIG. 4B. Moreover, each object contains the necessary geometrical information to efficiently reconstruct the polygon view of FIG. 4A. For example, the object that represents transistor 76 may include the length and width of the transistor.

Figure 5:
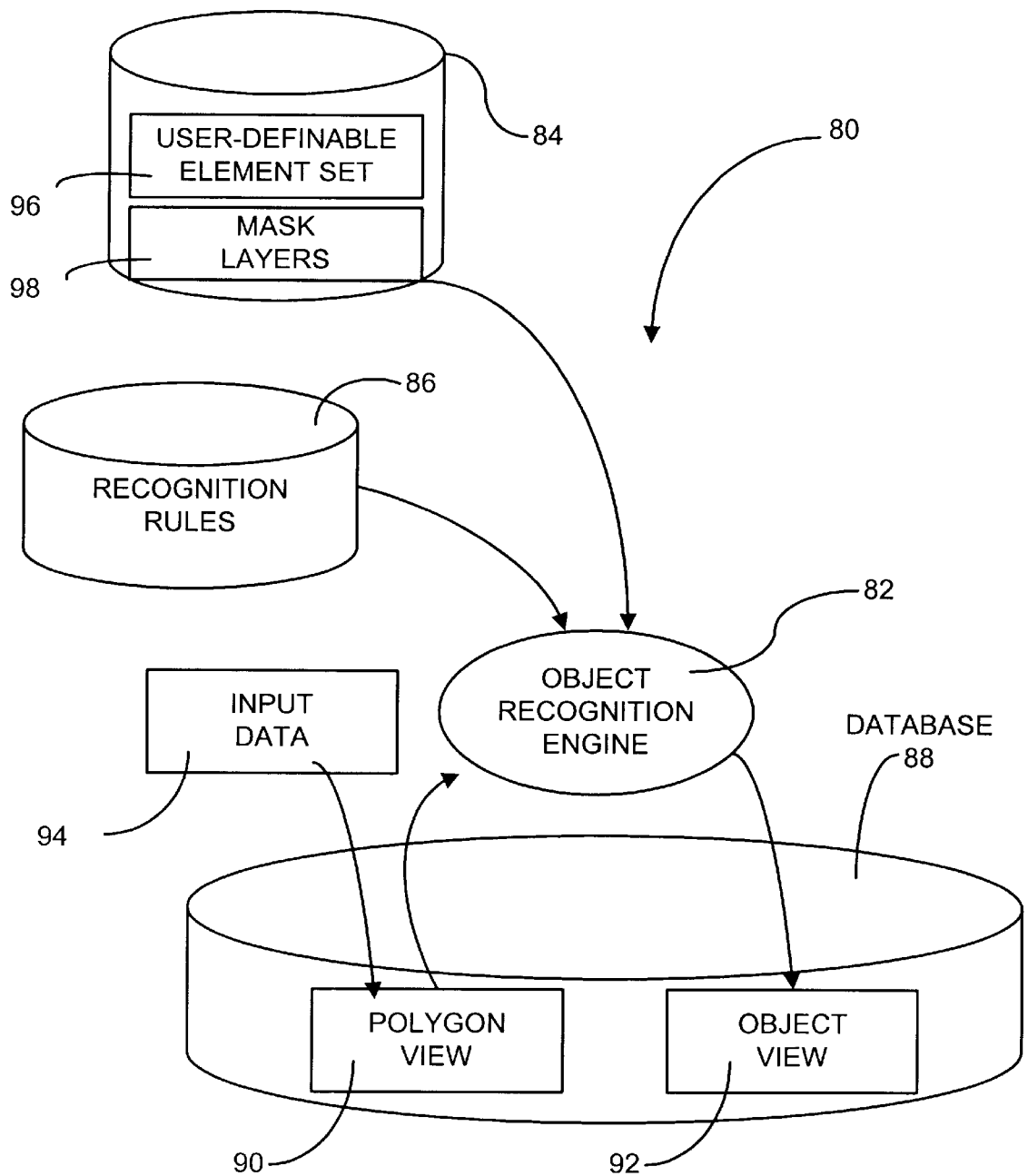
FIG. 5 is a diagram of a system architecture according to the present invention.

FIG. 5 shows a system architecture 80 that includes an abject recognition engine 82, a technology file 84, a recognition rules file 86, and a database 88 containing a polygon view 90 and an object view 92. Input data 94 describes the polygon-based layout that is to be converted into an object-based layout. The input data 94 is typically in a GDS-based format and is read into the database 88 to form the polygon view 90.

The technology file 84 contains a user-definable element set 96. The element set 96 includes a palette of elements types (e.g., transistors, diodes, contacts, wires, etc.) that are created by the user with the help of a programming language used to define polygon-based geometries in terms of object-based device parameters. The user knows the basic geometries contained in the input data 94 to be converted and uses this information to create the element set 96. The technology file 84 also contains mask layers 98 found in the polygon-based layout (and common to the equivalent object-based layout). For example, the mask layers 98 may define the first layer to be a diffusion layer, the second layer to be a polysilicon layer, the third layer to be a metal layer, etc.

The recognition rules 86 are programmed by the user. The recognition rules define a sequence of candidate elements (i.e., the candidate elements are members of the user-definable element set) and recognition statements associated with the candidate elements. The recognition statements are used to deduce information from the seed shapes (e.g., the centerline or width of a seed shape). This information is used to configure a candidate or exemplar element associated with the user-definable element set 96. The current candidate element is said to be "recognized" if geometries on its layers are fully contained within the geometries of the respective layers of a support view, as is further described below.

The object recognition engine 82 is a program running on computer 52. The recognition engine 82 uses the technology file 84 and responds to commands in the recognition rules 86 to convert the polygon view 90 to the object view 92 contained within the database 68. Further details of the object recognition engine and the conversion process are described below.

The database 88 is preferably a Forma® database developed by and commercially available from Mentor Graphics Corporation. Forma is an object-oriented database that allows for user-defined objects. Forma is particularly advantageous for representing IC, design data. Other databases may also be used. In the Forma database, a design consists of a library containing a collection of cells. A cell can have more than one view (layout, schematic, bounding box, etc.); the appropriate view is determined by the context in which it is used. Each view holds a collection of elements. Forma supplies a generic set of built-in element types (e.g., RECTANGLE, POLYGON, PATH, TEXT, INSTANCE), and also a programmable element type, called an extensible element, which can be configured using Forma's extension language to create types specific to an IC process (e.g., NTRAN, PTRAN, M1M2, etc.). Further implementations regarding Forma and the extensible element are discussed in Matheson et al., U.S. Pat. No. 5,592,392, which is hereby incorporated by reference.

A technology in Forma defines a collection of layers, a pallet of elements, and an extensible set of attributes (name-value pairs). The names are character strings, but the attribute values can be any of a fixed set of primitive types. These types include scalar values (e.g., Float64, Angle), array values (e.g., lnt32Array, String), and reference values (e.g., Elemid, AttrId), as well as an extensive collection of geometric values (e.g., Point, Rectangle, Polygon, Path) all organized as a protocol hierarchy.

Elements represent the devices and wires in a view. Unlike previous layout tools, Forma is not limited to a hard-coded element set. Instead, each view is associated with one technology defining the types of elements that can be stored in it. Elements in Forma are composed of attributes belonging to various categories (e.g., GRAPHICAL, MASKABLE, EDITABILE, DEFINING). A single element attribute may belong to several categories. Forma provides a mechanism for iterating over the attributes of an element a particular category (or set of categories). For example, to extract all of the layout associated with an element, Forma iterates over its MASKABLE attributes. On each iteration, the current geometric primitive and its associated mask layer are used to generate the corresponding GDS-based layout in polygonal form.

Elements are also programmable objects. Element attributes that can be modified (e.g., the width of a RECTANGLE) belong to the EDITABLE category, but not all modifiable attributes are necessarily independent of each other. For example, the lowerLeftCorner attribute of a RECTANGLE can be set, potentially affecting both its length and width attributes.

The DEFINING category allows element authors to supply an orthogonal subset of EDITABLE attributes that completely characterize an element. In other words, clients can cause an element to attain any achievable configuration by setting only its DEFINING attributes.

Several views may exist in the illustrated embodiment. The views (many of which are not shown) include an input view, the polygon view 70 (also called an unrecognized view), the object view 72 (also called the recognized view), a support view, a seed view, and an output view. The polygon view contains geometrical shapes to be converted into objects. The recognized view contains objects that represent elements from the polygon view that have been recognized. At the start of the conversion process, the recognized view is void of object elements. Each time a candidate element is recognized, it is added to the recognized view. Consequently, as the conversion process continues, the number of elements in the object view grows. The unrecognized view contains merged polygon elements that are not yet recognized. When a candidate element is recognized, its, corresponding geometries are removed from the respective layers of the unrecognized view. The support view, however, continues to represent the union of the recognized and unrecognized views throughout the recognition process. The seed view is formed from Boolean mask operations that are used to logically combine different layers as defined in the recognition rules. For example, to identify all likely P-transistor gate regions in a CMOS process having mask layers of polysilicon (POLY) and p-type diffusion (PDIFF), a new layer is synthesized with geometries that are the logical AND of geometries on those layers by using the following layer definition:

LAYERDEF ptran=POLY AND PDIFF

Once defined, a synthesized layer can be used to synthesize other layers. The seed view contains seed shapes. A current seed shape is a shape that the recognition engine 62 is analyzing. The output view is the Linion of the object elements from the recognized view and the geometrical shapes from the unrecognized view after the recognition process is complete.

Figure 7:
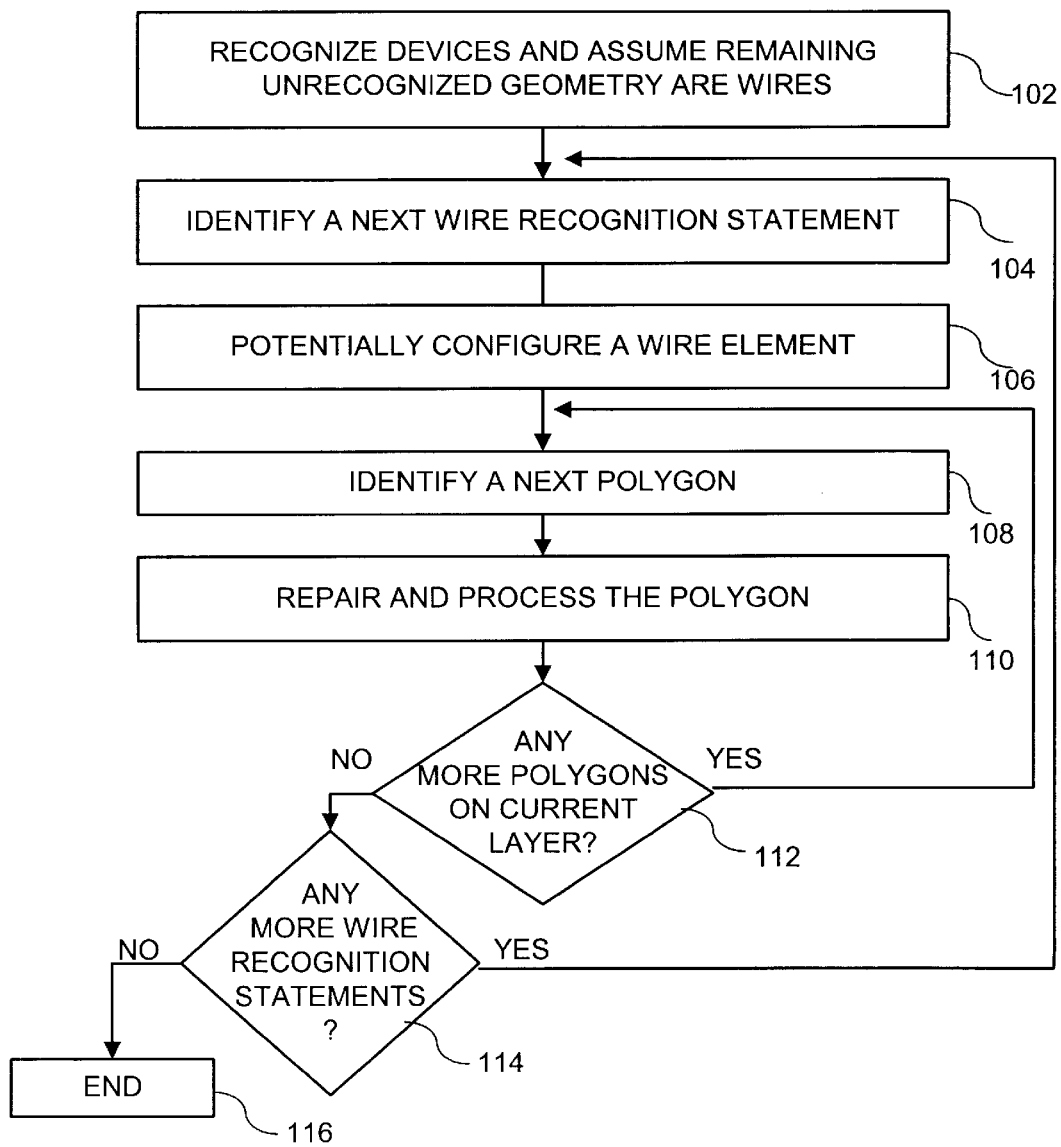
FIG. 7 is a top-level flow diagram for converting a polygonal wire to a path-based wire using the system architecture of FIG. 5.

FIG. 7 shows a high-level flow diagram 100 for converting polygon-based wires to path-based wires. In step 102, devices (e.g., transistors, diodes, capacitors, and resistors) are recognized using a desired technique. Further details on recognizing devices and converting devices to; objects are described in copending patent application Ser. No. 08/943, 395, now U.S. Pat. No. 6,064,806, entitled "SYSTEM AND METHOD FOR CONVERTING A POLYGON-BASIED LAYOUT OF AN INTEGRATED CIRCUIT DESIGN TO AN OBJECT-BASED LAYOUT," having an attorney docket number of 1011-41545, filed on Oct. 3, 1997, said application being is hereby incorporated by reference. The inventors on this incorporated reference are John Lakos and Richard Eesley. Other techniques for recognizing devices can be used. When devices are recognized, the geometry that remains is assumed to be wires (still in polygonal form) that connect the devices. The goal is to convert this remaining geometry to path-based wire elements, each having a centerline and a width. The path-based wire elements may extend at any angles. Additionally, the geometry can be recognized independent of electrical connectivity stored in a database (e.g., a netlist).

In step 104, a wire recognition statement is identified from the recognition rules 86. The recognition rules 86 specify on which layers wire recognition is to occur. When specifying a layer one also identifies the element to use and the name of the element attribute for the recognition engine 82 to use to reconfigure the path. If the element is not specific to that layer, then the name of the element attribute indicating the layer is also be specified. An example recognition statement is shown below:

WIRE POLY "WIRE" peditable layer

In this example, the WIRE recognition statement programs the engine 82 to look on a layer POLY (the POLY layer is defined by the mask layers 98 in the technology file 84 (FIG. 5)) for wires (represented as polygons) using element "WIRE" (this element is defined in the element set 96). The element "WIRE" has two defining attributes called "peditable" (short for primary editable) and "layer". The peditable attribute defines the shape of the wire (i.e., a path) and the layer attribute defines the principal layer on which the wire element to run (i.e., the layer of geometry defined by the peditable attribute), although the WIRE element may potentially contains geometries on all of the layers. The WIRE recognition statement, of course, could take other forms, such as the following:

WIRE POLY "POLY_WIRE" peditable

In this case, the recognition engine 82 assumes that the wire element's peditable path attribute is located on layer POLY. Thus, the element itself has its layer predefined. Other wire formats may be used.

There may be one or more WIRE recognition statements in the recognition rules. Each WIRE statement is taken in turn (step 104). For each WIRE statement, the wire element identified in the WIRE statement is partially configured, if needed (step 106). This partial configuration is accomplished through the layer attribute (as mentioned above, there are instances where the layer attribute is not needed). In step 108, the database 88 scans the current layer for a polygon that has not yet been processed. The current polygon is then repaired and processed to determine if the polygon can be represented as a path (step 110). Repairing the wire is discussed in relation to FIG. 9. Processing is discussed in relation to FIG. 8. Regardless of whether the wire element was recognized in the processing step 110, in step 112 the database 88 scans the current layer for the next polygon. Steps 108, 110, and 112 are then carried out for the next polygon. Each polygon on the current layer, therefore, is analyzed using the current wire recognition statement. In other words, the recognition statement instructs the recognition engine to iterate over each polygon or the current layer. After iteration over all of the polygons on the current layer is completed, a check is made in step 114 to see if other recognition statements are listed in the recognition rules 86. If there is at least one more WIRE recognition statement, then steps 104 through 114 are carried out again as set forth above for that new WIRE recognition statement. This process continues for each WIRE recognition statement and the procedure ends (step 116) when the wire recognition statements are complete. It will be recognized to those skilled in the art that different programming techniques can be used to form the loops identified in FIG. 7. For example, FOR or DO/WHILE constructs can be used.

FIG. 8 shows the process step 110 of FIG. 7 in more detail. In summary, during the recognition phase, after device recognition is complete, the sequence of wire recognition commands is applied to the geometries remaining in the unrecognized view. The recognition engine 82 attempts to deduce a path whose perimeter exactly matches that of the polygon. If successful, the specified wire element is configured and tested against the geometries in the Support view. If the element is contained in the Support view, it is copied into the Recognized view and its geometry is subtracted from the Unrecognized view.

In step 120, a candidate path is deduced as a starting point. The candidate path is a sequence of centerline coordinates (vertices) and a width. The path should be distinguished from a wire element. The path that defines a single geometry independent of layer is used as an attribute (i.e. peditable) to configure the wire element. The WIRE element may consist of multiple geometries on several layers. To deduce a path in one approach, the respective averages of the current polygon's opposing vertices are used to obtain a centerline. The corresponding end edge defines the width. Deducing the path is discussed further below with reference to FIG. 6.

In step 122, the candidate path that is deduced in step 120 is converted to a candidate polygon. This conversion is accomplished by using the centerline coordinates and the width to calculate the polygon perimeter vertices. The candidate polygon is then compared to the current polygon in the unrecognized view (step 124). This comparison is a single geometry comparison and is made to determine if the candidate polygon is the same as the current polygon (step 120), modulo rotation of vertices. To accomplish the comparison, the vertices of the candidate polygon are compared to the vertices of the current polygon. If the two polygons are not the same, then the procedure 110 returns (step 128) to step 112 (FIG. 7) to determine if a polygons are remaining in the current layer as set forth above. If the two polygons are the same, then the wire element is configured using the path as an attribute (step 130), so that the wire element takes on the appropriate geometries on all layers. To be the "same" does not necessarily mean identical because the same polygon may be represented differently by having its vertices numbered differently. Thus, a rotation of the vertices can be applied to align the vertices on each polygon to check if there is a match. A counter clockwise orientation is used for the vertex indices. In step 132, the fully configured wire element is compared with corresponding geometries in the support view. That is, a check is made to see if the geometries (potentially on multiple layers) of the wire element are contained in the support view. If the geometries of the wire element are fully contained within the support view (step 134), then a copy of the wire element is added to the recognized view and the corresponding geometries are removed from the unrecognized view (step 136). If the wire element is not recognized, then the procedure 110 returns (step 138).

Returning to step 120 to expand on deducing a path, the following assumptions are used for the path recognition:

(1) The Polygon to be recognized was at one time represented as Path with even width and its centerline on grid.

(2) The Path was converted to a Polygon by calculating the vertices of the perimeter using real coordinates and then independently rounding they to the closer integer (grid) coordinate.

(3) The resulting Polygon does not cross itself.

Figure 6:
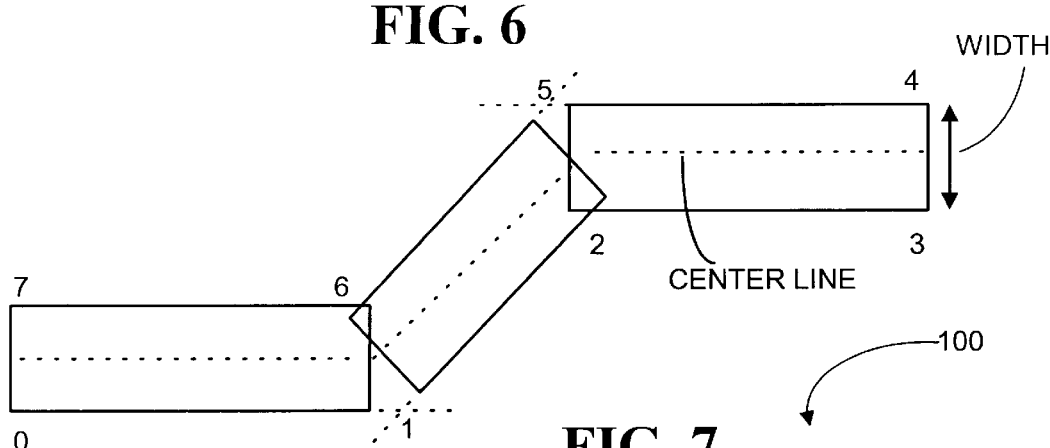
FIG. 6 shows a polygonal wire with a centerline and vertices used to create a path.

FIG. 6 shows a non-manhattan path. To deduce the path, the perimeter is constructed by identifying vertices 0 through 7 with integral coordinates. Where necessary, edges of a polygon segment can be extended to find the proper vertices, as shown by the dashed lines forming vertices 1 and 5. Using real numbers initially, parallel lines a half width to the left and right of each directed segment of the centerline are calculated. Then the points of intersection for consecutive segments are rounded to obtain a gridded approximation of the perimeter. Notably, each vertex on the centerline is always the average of the two corresponding points of intersection if they exist. If an end is not known, it can be found through trial and error using the following algorithm:

```
for (i=0; i<N; ++i)
    for (j=1; j<N/2; ++j)
        if (edge[i+j] is not approximately parallel to edge[i-j]) break;
        if (edge[i+j] is not in same direction as edge[i-j]) break;
        if (j>N/2) break; // i is probably the index of an "end" edge
``` where the variable "i" is the index of one edge, "j" is the index of another edge and "N" is the number of edges. This algorithm essentially allows an edge to be picked arbitrarily. Edge weights may be used to influence the choice for efficient computation. Then the perimeter of the polygon is walked to check if the corresponding edges are approximately parallel and that the relative orientation of the directed edges i and j are correct. These determinations are accomplished using vector calculus operations rather than trigonometric operations. Trigonometric operations are substantially slower since angles need to be calculated using transcendental functions implemented as subroutines. Vector calculus operations allow the same computation to be accomplished using cross products and dot products implemented substantially in line, which can be accomplished an order of magnitude faster than trigonometric operations.

Once an edge corresponding to an end of the path is known, it is easy to walk the perimeter of the polygon, averaging corresponding vertices (e.g., 7&0, 6&1, 5&2, 4&3) to recover the original centerline. The result is verified by converting the path back to a polygon and checking that the two polygons are equivalent (modulo rotation of vertex numbers). By convention, edge[i] connects vertex[i] to vertex[i+1], and all arithmetic on edge and vertex indices is modulo the number of edges, N. The notion of approximately parallel is used because the corresponding edges of a segment may not be exactly parallel when snapped to an integer grid.

Rectangular polygons can be recognized as short-wide or long-narrow paths. Circuit designers along with CAD tools (such as a compactor) may be confused by an arbitrary orientation of the centerline. Edge weights 0 (not adjacent), 1 (partially adjacent), and 3 (fully adjacent) with respect to recognized geometry are used to influence the choice. The opposing edges with the greater combined weight are treated as ends. In the event of a tie, a long-narrow wire is preferred. Note edge weight may also be used to expedite the determination of ends for non-rectangular paths.

Figure 1A:
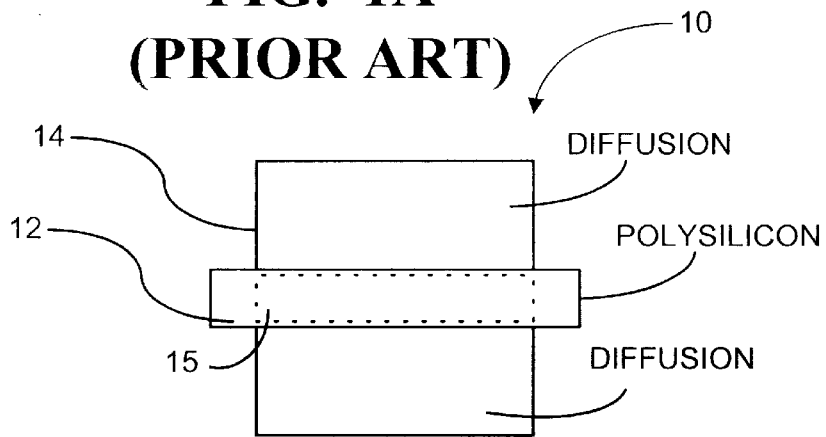
FIG. 1A shows a transistor represented as a polygon in accordance with a polygon-based layout.
Figure 1B:
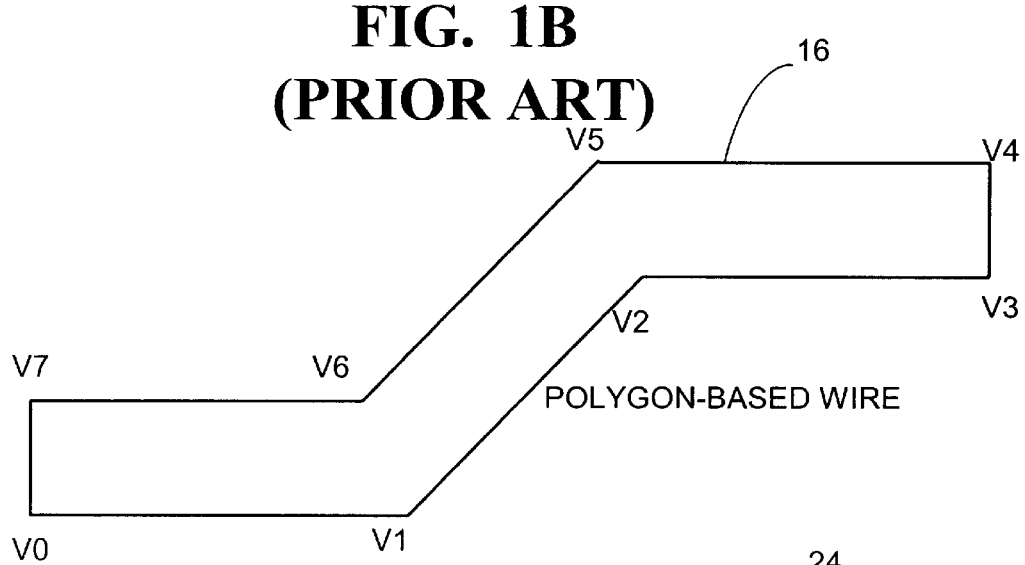
FIG. 1B shows a wire represented in polygonal form.
Figure 1C:
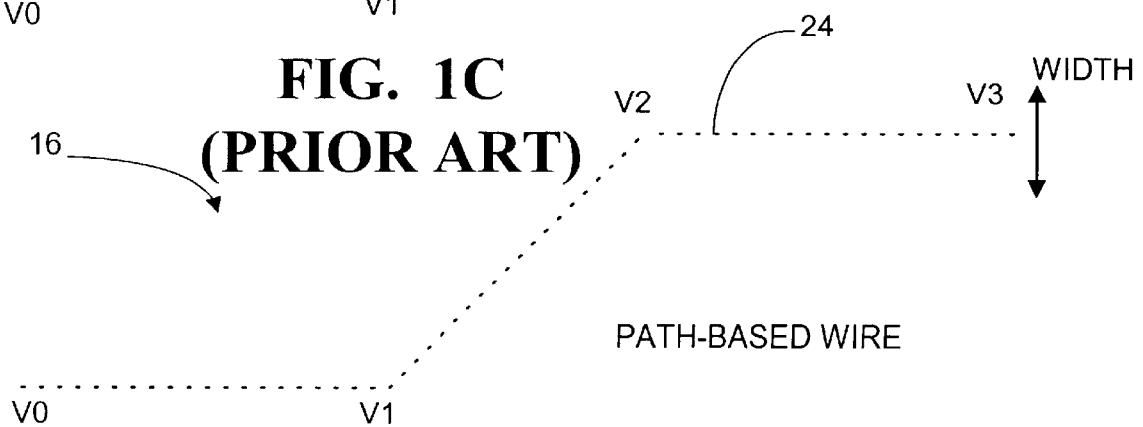
FIG. 1C shows the wire of FIG. 1B in path-based form
Figure 2A:
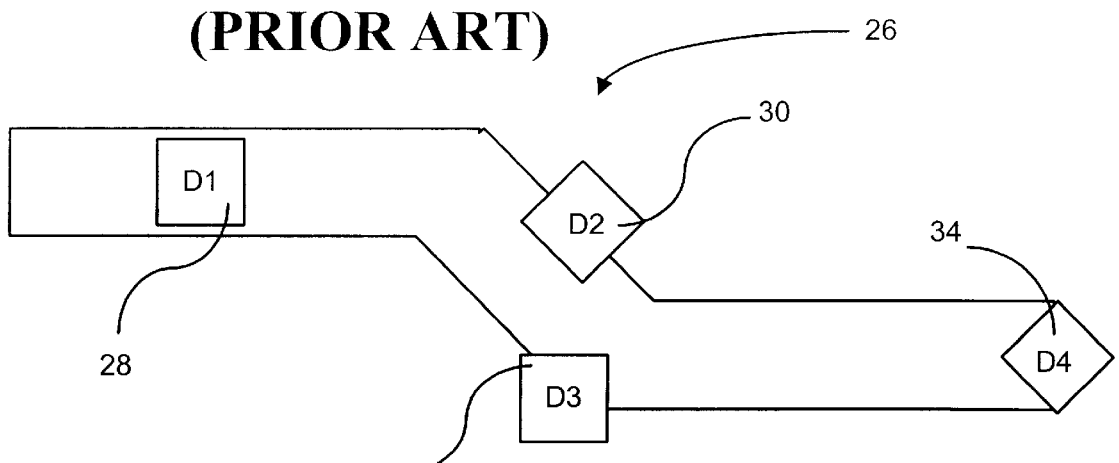
FIG. 2A shows a wire with device geometries overlapping portions of the wire.
Figure 2B:
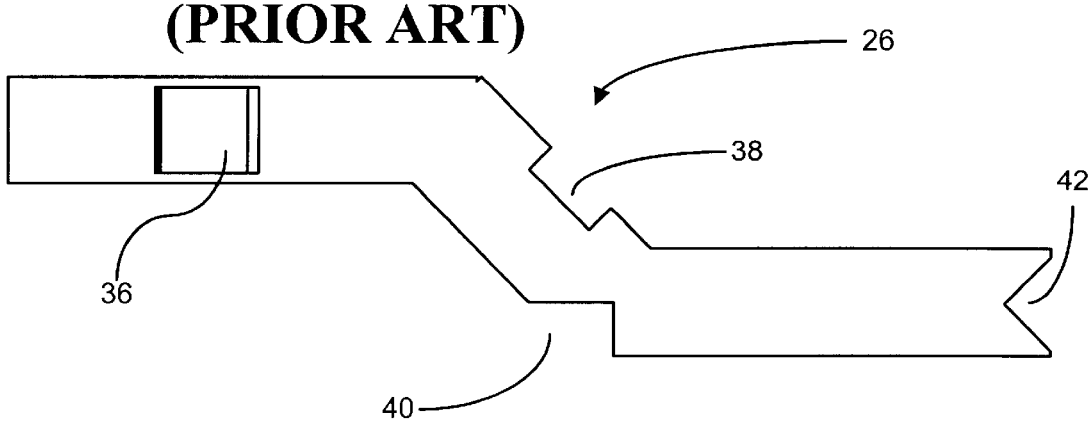
FIG. 2B shows the wire of FIG. 2A with the device geometries removed, leaving a damaged wire.

Path reparation is now described in relation to FIG. 9. As device geometries are extracted from the unrecognized view, it is not uncommon for overlapping geometries to be lifted from wires resulting in a geometry that is not a simple path. Thus, the damaged geometries no longer correspond to a path. The four common types of damage are illustrated in FIG. 2 and have already been described.

In order to recognize a Path as described in FIG. 8, it is first necessary to repair the wire geometry. The problem is formulated as follows: Given (1) a closed Polygon with N>2 edges, and (2) an array of weights identifying whether each edge is fully adjacent, partially adjacent, or not adjacent to geometry in the Recognized view, modify the Polygon in a way that it can be recognized as a Path that is still contained in the Support view.

Figure 9A:
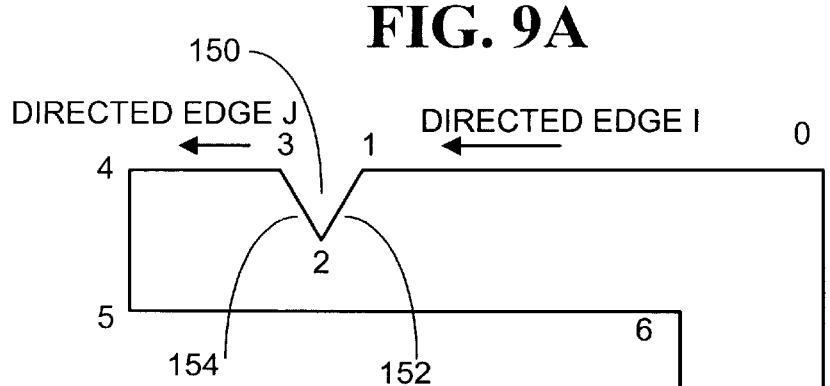
FIGS. 9A, 9B and 9C show various types of wire damage to be repaired.
Figure 9B:
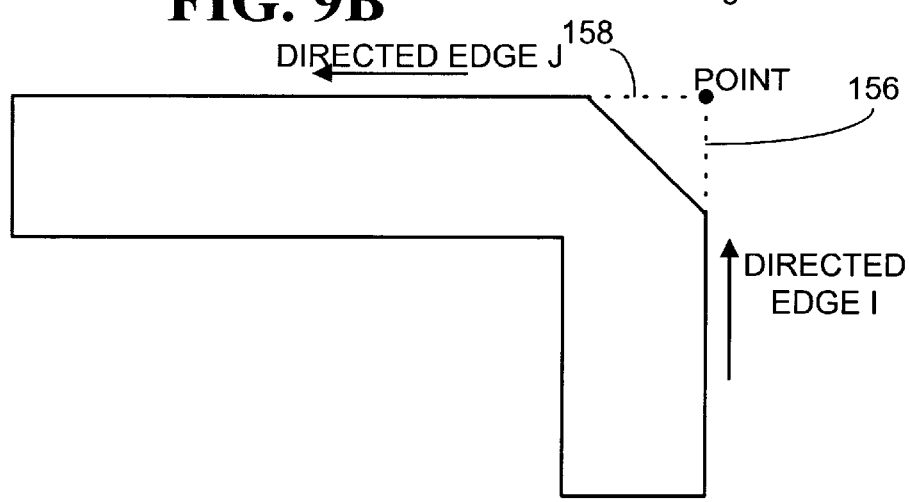
Figure 9C:
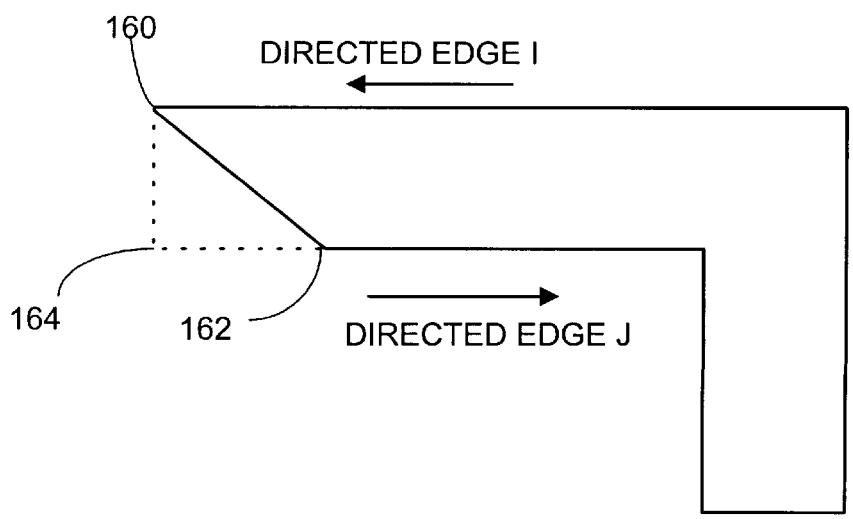

The procedure for repairing (perimeter) damage of types in FIGS. 9A, 9B, and 9C is to iterate over the edges of the polygon looking for conditions that indicate a repair is needed. Each of the three types of perimeter damage has both a corresponding detection and replacement routine. One set of detection routines useful in the illustrated embodiment are shown in Table 1. A set of replacement routines in the illustrated embodiment are shown in Table 2. Each detection routine takes the current polygon configuration, edge adjacency information, and an edge index, and returns the index of a second edge satisfying the condition or −1 if no such edge exists. If the condition is detected, the corresponding replacement routine is called with the two edge indices to repair the detected damage and update the edge-adjacency array Other detection and replacement routines may be used.

FIG. 9 illustrates the conditions under which each type of perimeter damage will be detected for the specified polygon, edge adjacency, and edge indices i and j.

TABLE 1

| A | 1. | (j − i + N) mod N > 2 |
|---|---|---|
| | 2. | edge[i] and edge[j] are not touching recognized geometry |
| | 3. | edge[i + 1] . . . edge[j − 1] are touching recognized geometry |
| | 4. | edge[i] is approximately parallel to edge[j] |
| | 5. | edge[i] is approximately collinear with edge[j] |
| | 6. | edge[i] has positive projection on edge[j] |
| B | 1. | (j − i + N) mod N > 1 |
| | 2. | edge[i] and edge[j] are not touching recognized geometry |
| | 3. | edge[i + 1] . . . edge[j − 1] are touching recognized geometry |
| | 4. | edge[i] is not approximately parallel to edge[j] |
| | 5. | extension of edge[i] intersects negative extension of edge[j] at point p |
| | 6. | point p is not part of either edge[i] or edge[j] |

TABLE 1-continued

| C | 1. | (j − i + N) mod N > 1 |
|---|---|---|
| | 2. | edge[i] and edge[j] are not touching recognized geometry |
| | 3. | edge[i + 1] . . . edge[j − 1] are touching recognized geometry |
| | 4. | edge[i] is approximately parallel to edge[j] |
| | 5. | edge[i] is not approximately collinear with edge[j] |
| | 6. | edge[i] has negative protection on edge[j] |

Table 1, section A is used to detect damage in FIG. 9A. FIG. 9A shows a series of edges forming the perimeter of the polygon. Edge 0 is defined as the edge between vertices 0 and 1. Edge 1 is the directed edge between vertices 1 and 2, and so on. The first statement (i.e., A(1)) in Table 1 is (j−i+N) mod N>2, where i and j are edge indices and N is the total number of edges. This statement ensures that edge j is; more than 2 edges away from edge i. This statement is satisfied in FIG. 9A because edge j is 3 and edge i is 0. The "mod" notation refers to a modulo calculation. This allows the relative positions of i and j to be examined without concern to any particular numbering of the vertices (e.g., edge 1 is 3 edges after edge 7).

The statement A(2) in table states edge[i] and edge[j] are not touching any recognized geometry. This statement causes recognized geometry to be analyzed in relation to the damaged shape. That is the recognized geometry may have been removed to form the damage shown at 150. If the perimeter or interior of the recognized geometry touches an identified edge, then a negative response is returned. For example, for purposes of discussion it will be assumed that the recognized geometry touches (or contains) the entirety of edges 1 and 2 of FIG. 9A. However, current edges i (edge 0) and j (edge 3) shown in FIG. 9A are not touching the recognized geometry (except at the end points) so a positive result is returned.

The statement A(3) in table 1 states that edge[i+1] to edge[j−1] are touching recognized geometry. Edge i+1 is the edge shown at 152. Edge j−1 is the edge shown at 154. These edges are touching recognized geometry given the assumption that recognized geometry touches edges 1 and 2.

The statements A(4) and A(5) check if directed edges i and j are parallel and collinear. FIG. 9A shows that directed edges i and j are currently parallel and collinear. Thus, these statements are satisfied as well.

The statement A(6) in table 1 check, to ensure that directed edges i and j are pointed in the same direction.

If statements A(1) through A(6) are satisfied, then the condition shown in FIG. 9A exists and repairs are made according to the algorithm shown in Table 2 (A), as is described further below.

Table 1 (B) and (C) correspond to FIGS. 9B and 9C, respectively. The statements are similar to those described in relation to FIG. 9A. If all to conditions of Table 1 (B) are satisfied, then the current geometry is damage according to the situation shown in FIG. 9B. Consequently, repairs can be made according to an algorithm described in Table 2 (B). Similarly, conditions of Table 1 (C) indicates a damaged geometry as indicated in FIG. 9C, and repairs are made according to Table 2 (C).

TABLE 2

| A: | a. | set edge Weights[i] = PARTIALLY_ADJACENT |
|---|---|---|
| | b. | remove vertex[i + 1] . . . vertex[j] |
| B: | a. | set edge Weights[i] = PARTIALLY_ADJACENT |
| | b. | set edge Weights[j] = PARTIALLY_ADJACENT |

TABLE 2-continued

```
    c.  remove vertex[i + 1] . . . vertex[j − 1]
    d.  set vertex[j] to intersection of (extended) ray[i] and −ray[j]
C:  a.  set edge Weights[i + 1] = FULLY_ADJACENT
    b.  remove vertex[i + 2] . . . vertex[j − 1]
    c.  set edge E = (point p where perpendicular to edge[j] at
        vertex[j]
            intersects edge[i], vertex[j]
    d.  set edge E = (vertex[j − 1], point p where perpendicular to
        edge[i]
            at vertex[i + 1] intersects edge[j])
    e.  foreach k in [i + 1 . . . j]
        translate edge E to its left until vertex[k] is not to the left
        of E
    f.  set vertex[i + 1] = E[0] and vertex[j] = E[1]
```

In the illustrated embodiment, algorithm of Table 2(A) rep;airs the damage shown in FIG. 9A shown at 150. Table 2(A)(a) states "setedgeweight[i]=PARTIALLY_ADJACENT". There are three types of weights: NOT_ADJACENT, PARTIALLY_ADJACENT, and FULLY_ADJACENT. NOT_ADJACENT means an edge is not touching recognized geometry. FULLY_ADJACENT, by contrast, means an edge touches or is contained in recognized geometry for its entire length. An edge is PARTIALLY_ADJACENT to recognized geometry if it is neither FULLY_ADJACENT nor NOT_ADJACENT. A PARTIALLY_ADJACENT edge intersects the perimeter and/or interior of recognized geometry, but not for its entire length. In FIG. 9A edges 152 and 154 are FULLY_ADJACENT and directed edges i and j are NOT_ADJACENT. The array element setedgeweight[i] is set to PARTIALLY_ADJACENT. The statement identified in table 2(A)(b) then removes vertices i+1 up to vertex j. This leaves the vertex i (e.g., 0 in FIG. 9A) and j+1 (e.g., 4) in FIG. 9A, effectively extending the directed edge i to the end of directed edge j (i.e., j+1). Thus, the remaining vertices form an undamaged wire. The vertices are renumbered to fall between 0 and one less than the new number (N) of vertices before the next application of wire detection or reparation.

The operations performed in the damage repair algorithm of Table 2 (B) are similar to those described in relation to Table 2(A). An operation not yet discussed, however, is the set vertex operation. The set vertex[j] operation sets the origin of directed edge j (arid the termination of directed edge j−1) to the point P indicated in FIG. 9B. This selection of the appropriate point is determined by extending directed edge i in the positive direction 156 shown in FIG. 9B and extending directed edge j in the negative direction 158 to intersect at point P.

The commands used in the damage repair algorithm of Table 2(C) are used in the illustrated embodiment to square a damaged end of a wire as shown in FIG. 9C. The new end of the wire (shown in dashed lines) illustrates that the point 160 is used as an end point and the point 162 is extended to point 164. There are two symmetric ways to fix the damage: (1) vertex j is moved and (2) vertex i+1 is moved. This choice depends on which vertex extends further outward. In the example of FIG. 9C, the vertex i+1 extends further than vertex j, so vertex j is moved. Any intervening vertices that extend further than edges i+1 and j may cause additional movement outward.

Figure 10A:
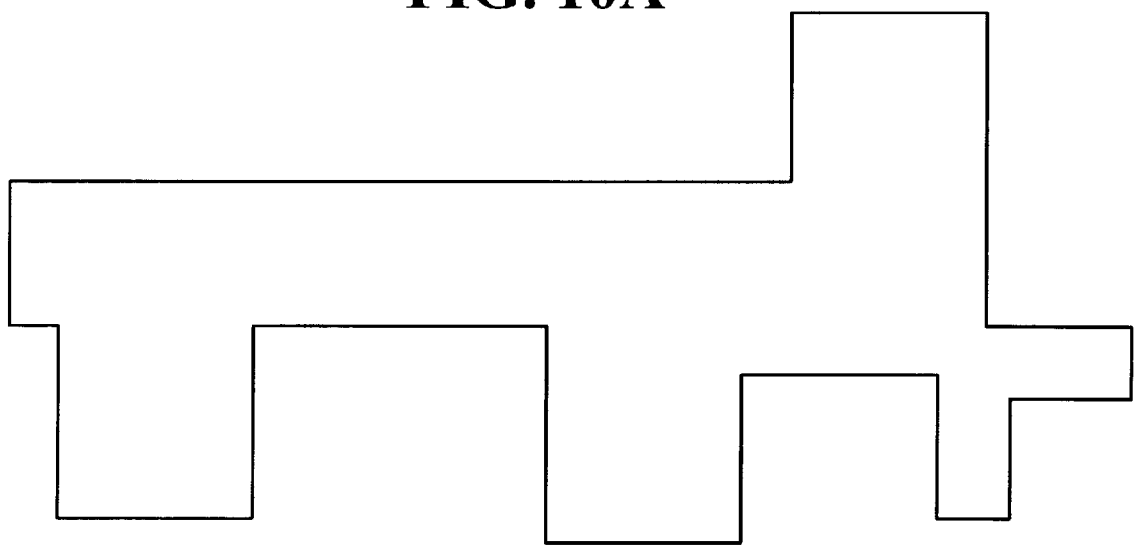
FIGS. 10A and 10B represent a complex polygonal wire and its converted path-based wires.
Figure 10B:
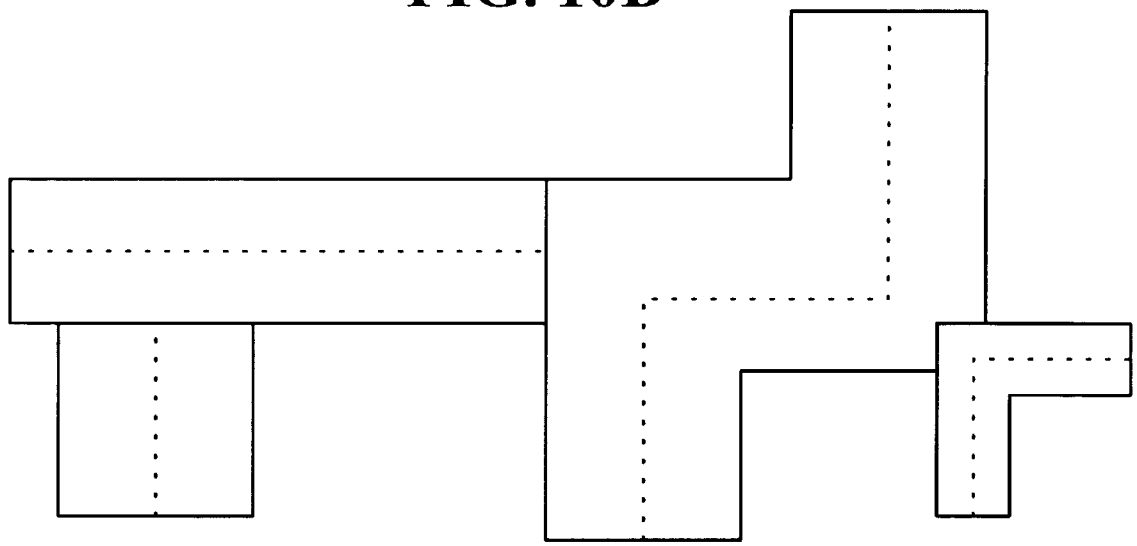

Path partitioning is now described in relation to FIGS. 10 and 10B. Polygons that result from intersecting wires cannot be recognized as a single path. In such cases, the polygon must be decomposed into sub-polygons that can be recognized. This generalization of the exact wire recognition problem is to find a set of paths:

(1) whose geometry is contained in the Support view,
(2) that minimizes the area not covered by the original polygon,
(3) of minimal cardinality (i.e., number of distinct paths), and
(4) having minimal combined number of segments (or corners).

Using dynamic programming, all reasonable partitions of the polygon are trier and one is selected that minimizes the cost criteria above. Table 3 illustrate, the top-level recognition procedure, recognizePaths, and its associated (C++) dynamic programming data structure, Cache. The input to the procedure is an array of paths to hold the optimal solution, the original polygonal wire, the edge adjacency (weights) with respect to recognized geometry, and a technology-dictated minimum wire width. The original polygon is copied and repaired using the techniques already described. The recursive algorithm recognizePaths1 (described below) is then invoked to obtain (the index of) an optimal solution.

TABLE 3

```
struct Cache {
    PathCache d_paths;// current set of unique paths
    PolygonCache d_polygons;// current set of unique sub-polygons
    Int32Matrix d_solutions;// map each sub-polygon to best set of paths
    Float64Array d_scrapArea;// left-over-area cost for each solution
    Int32Array d_numPaths;// path-count cost for each solution
    Int32Array d_namSegments;// segment-count cost for each solution
    Int d_minPath Width;// minimum width for path on this layer
};
double       // return total unrecognized area
recognizePaths(PathArray *result,// loaded with best solution
        const Polygon &shape,       // original polygon
        const Int32Array &edgeWeights,      // with adjacency
        int minPath Width)// avoid design rule violations.
{
    Cache data; // records solutions with cost for dynamic programming
        dated_minPathWidth minPathWidth; // initialize scalar value in
    struct
        Polygon shape2 = shape;
        Int32Array edgeWeights2 = edgeWeights;
        repairPath(&shape2, &edgeWeights2);
        int bestSolutionIndex = recognizePath1(&data, shape2,
    edgeWeights2);
        Int32Array& pathIndices = data d_solutions(bestSolutionIndex];
        for (int i = 0; i < pathIndicies.numElements0; ++i)
        Result –> append(data.d_paths[pathIndicies[i]];
        return data.d_scrapArea[bestSolutionIndex];
}
```

The Cache data structure contains two separate associative arrays to hold the unique sub-polygons and paths encountered during exhaustive search. The Cache also contains a mapping from each polygon to the set of paths that optimally represents it. Three parallel arrays are used to track the cost of each solution. The minimum path width is also stored for reference. When the algorithm returns to the top-level, the Cache (initially empty) contains all of the sub-polygons resulting from recursive partitioning. The integer value returned identifies the index of the original polygon in the polygon cache—the corresponding row in the solution matrix contains the indices in the path cache for the optimal path-based representation. The final 4 lines in Table 3 extract the optimal solution and load the paths into the client-supplied PathArray, returning the amount of unrecognizable geometry as a double.

The recursive partitioning algorithm (Table 4) exploits dynamic programming techniques to avoid solving any sub-problem more than once. On entry, the index of polygon is looked up in the cache. If found, the optimal partition for this polygon has already been determined; the index is used as the solution. Otherwise an attempt is made to recognize the polygon as a simple path. If successful, the path is entered in the path cache, the polygon is added to the polygon cache, and a corresponding row is created in the solution matrix consisting of just the one index of the recognized path, and return the solution index.

If this polygon cannot be recognized as a simple path, the polygon is partitioned into two sub-polygons, the function is called on each sub-polygon recursively, and the individual solutions are merged to form a solution for this polygon. How the polygon is partitioned will determine the quality of our solution.

TABLE 4

Assume that any damage to the polygon has already been repaired.
Lookup the current shape in the polygon cache; if found return its index.
if we can recognize the polygon as simple path
    If the path's width is below the minimum
        Add to cache solution with no paths and return its index.
    Add to cache solution with recognized path and return its index.
        // No easy solution; we're forced to divide
        // the polygon into two sub-polygons.
Int bestSolution.1 = −1. bestSolution2 = −1; // invalid index values
For each edge index, i of the polygon
    For each edge index, j of the polygon
        For each way to partition the polygon based on edges i and j
            Divide the problem into two problems: shape1 and shape2.
            Repair each subpolygon (if needed).
            Call this procedure recursively on each subproblem.
            If the new combined solution improves on the current one
                Record the new indices in bestSolution1 and bestSolution2.
        If bestSolution1 now holds a valid index (>= 0)
            If the combined area of the solutions are zero
                If the combined number of segments is exactly 2
                      break; // any solution with 2 segments leaving 0 area is best
If bestSolution1 now holds a valid index
    Add to cache solution combining both best solutions and
        return its index.

The approach taken here is to try all reasonable partitions and install the solution corresponding to the partition resulting in a path-based representation of minimal cost as defined above. Although the number of arbitrary polygonal partitions is essentially infinite, a discrete subset of useful partitions is characterized using 3 disjoint criteria: T, L, and X. (See Table 5).

TABLE 5

Figure 11A:
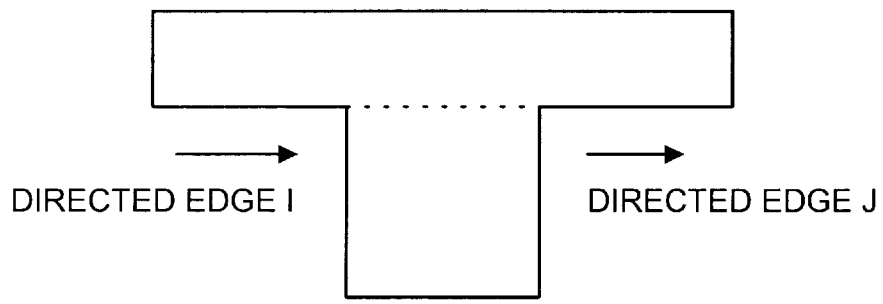
FIGS. 11A, 11B, and 11C represent three different conditions for partitioning a complex polygon into path-based wires.
Figure 11B:
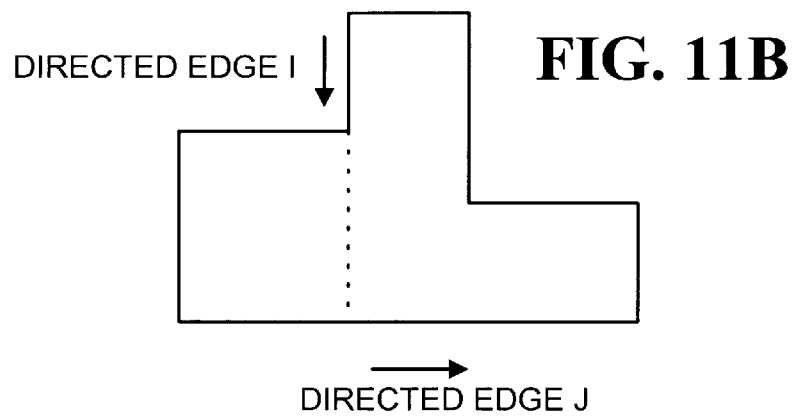
Figure 11C:
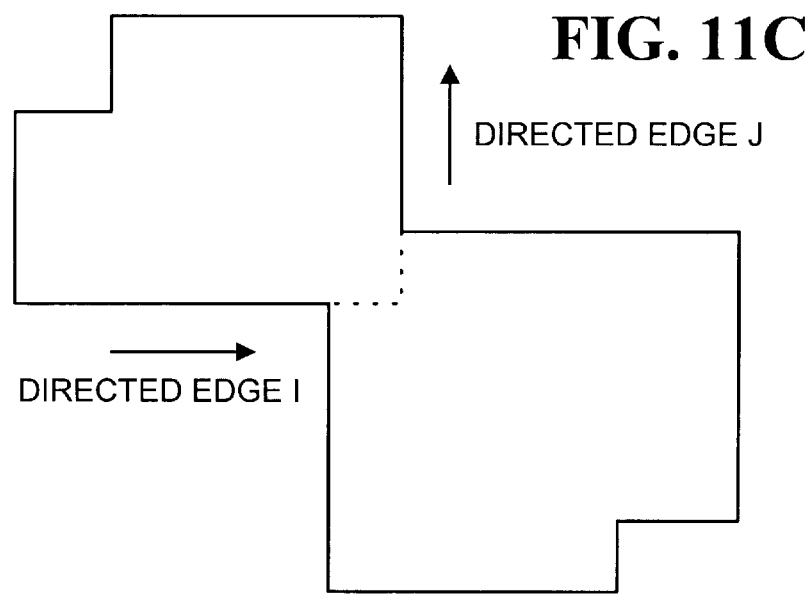

See FIGS. 11A, B, and C for conditions T, L, and X respectively.
3 edges indices i and j such that for a polygon with N edges:
T:  1.  (j − i + N) mod N > 2
     2.  edge[i] is approximately parallel to edge[j]
     3.  edge[i] is approximately collinear with edge[j]
     4.  edge[i] has positive projection on edge[j]
     5.  edge[i] has negative orientation with edge[i + 1]
     6.  ray[i] intersects ray[j − 1] at point p
     7.  ray[i] does not intersect any other edge
L:  1.  (j − i + N)mod N > 1
     2.  Either edge[i] is not approximately collinear with edge[j]
         or edge[i] has negative projection on edge[i + 1]
     3.  edge[i] has negative orientation with edge[i + 1]
   3'.  edge[i − 1] has negative orientation with edge[i]
     4.  ray[i] intersects edge[j] or vertex[j]
   4'.  -ray[i] intersects edge[j] or vertex[j]
     5.  ray[i] does not intersect any other edge or vertex at point q
         such that | q − vertex[i] | < | p − vertex[i] |;
         if | q − vertex[i] | = |p − vertex[i] | then q must
         not be part of an edge whose index falls between i and j
   5'.  -ray[i] does not intersect any other edge or vertex at point q'
         such that |q' − vertex[i + 1] | < | p' − vertex[i + 1] |;
         if | q' − vertex[i + 1] | = | p' − vertex[i + 1] | then q' must
         not be part of an edge whose index falls between j and i + 1

TABLE 5-continued

X:  1.  (j − i + N) mod N > 1
     2.  edge[i] is not approximately parallel to edge[j]
     3.  ray[i] intersects -ray[j] at point p
   3'.  -ray[i] intersects -ray[j] at point p'
     4.  ray[i] does not intersect any other edge at point q
         such that | q − vertex[i + i] | ≦ | p − vertex[i + 1]|
   4'.  -ray[i] does not intersect any other edge at point q'
         such that | q' − vertex[i] | ≦ | p' − vertex[i]
     5.  -ray[j] does not intersect any other edge at point r
         such that | r − vertex[j] | ≦ | p − vertex[j] |
   5'.  ray[j] does not intersect any other edge at point r'
         such that | r' − vertex[j + 1] | ≦ | p' − vertex[j + 1] |

By far the most common, the T partitioning criteria identifies wires that form T-like connections (though not necessarily at 90 degrees). If two wire edges, edge[i] and edge[j], are collinear and edge[i] can be extended through the interior of the polygon to meet edge[j], then the polygon can usefully be partitioned by severing the geometry on either side of the extended edge. The algorithm requires that the polygon be copied into shape1 and shape2, and then the T vertex replacement algorithm is used (Table 6) to remove unwanted vertices corresponding to the severed geometry. Although partitioning does not make use of edgeweights directly in these algorithms, the edge adjacency is maintained so that each sub-polygon can be repaired (if necessary) before attempting to recognize it as a path.

TABLE 6

T:  REPLACEMENT FOR SHAPE 1:     (left of partition)
    a1. if edgeWeights[i] = ALL_ADJACENT &&
        edgeWeights[J] = ALL_ADJACENT
        then leave edgeWeights[i] = ALL_ADJACENT
        else sat edgeWeights[i] = PART_ADJACENT
    a2. Remove vertex[i + 1] . . . vertex[j]
    REPLACEMENT FOR SHAPE2:     (right of partition)
    b1. set edgeWeights[j] = ALL_ADJACENT
    b2. remove vertex[j + 1] . . . vertex[i]

The L criteria is particularly useful for recognizing multi-width wires and tapered power busses. The X criteria is used to recognize overlapping wires. The vertex replacement algorithms for L and X partitions are similar in concept to the one for T partitions, but considerably more involved. FIG. 10B shows how each of these criteria are applied to recognize the optimal path-based representation of a single complex wire.

Figure 12A:
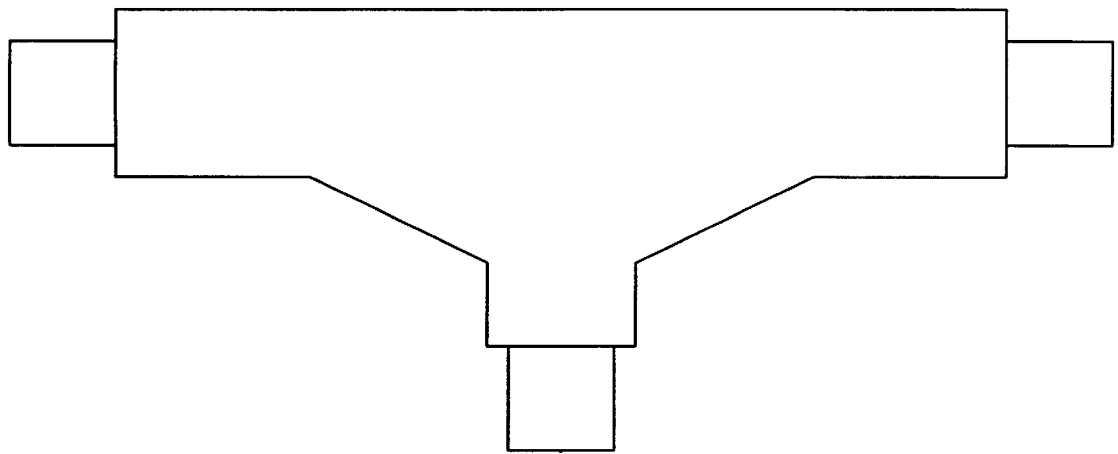
FIGS. 12A and 12B represent synthesizing Manhattan paths from an arbitrary polygon.
Figure 12B:
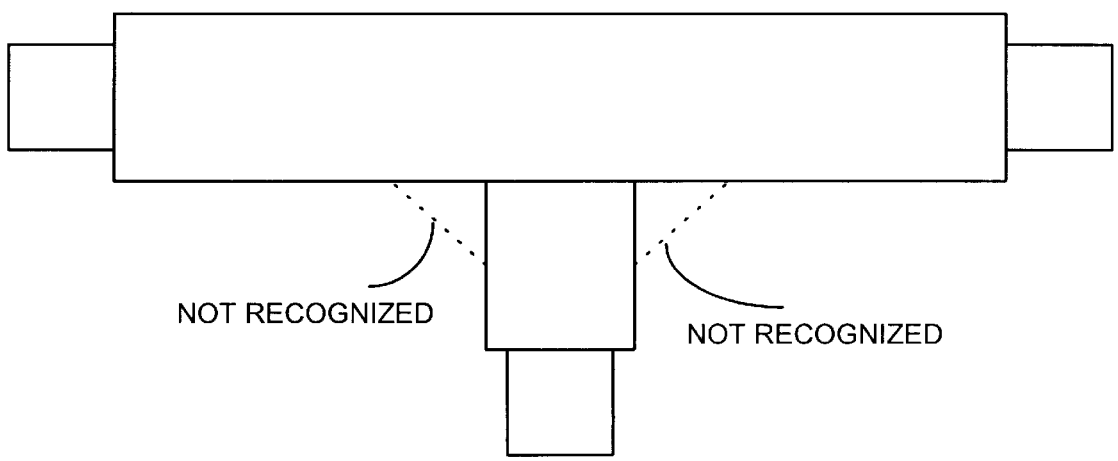

Wire synthesis is now discussed. A significant fraction of viable, full custom designs were originally conceived entirely as polygons. Arbitrary polygonal wires do not necessarily lend themselves to "exact" path-based representation (see FIG. 12A). Still, it is desirable to take advantage of IP invested in such designs. An alternative to exact recognition is presented that synthesizes manhattan paths (suitable for compaction) that are (1) contained within the original layout and (2) preserve connectivity (see FIG. 12B).

Each polygon remaining in the unrecognized view after device recognition represents geometry that may be required to connect two nodes originally on the same net. Forma's connectivity extraction capability is used to infer net information for geometries in the Recognized view. For each unrecognized polygon, a routing region is created that is the union of the unrecognized polygon and all adjacent geometry in the Recognized view. The problem now reduces to finding, for a specified width, (1) a minimal set of paths (2) of minimal length (3) with minimal total number of segments (corners), that restores the adjacent geometry in the recognized view to a single net.

Having illustrated and described the principles of the invention in a preferred embodiment, it should be apparent to those skilled in the art that the preferred embodiment can be modified in arrangement and detail without departing from such principles.

For example, although multiple views are described, such as a polygon view, support view, recognized view, etc., the number of views used can be modified so that less or more views are used to carry out the recognition process.

In view of the many possible embodiments to which the principles of the invention may be applied, it should be recognized that the illustrated embodiment is only a preferred example of the invention and should not be taken as a limitation on the scope of the following claims. The steps described in a claim can be taken in any sequence unless their order is specified. I claim as the invention all that comes within the scope of these claims.

I claim:

1. A method of converting a polygon-based wire to an object-based wire in an integrated circuit design, the method comprising:

providing a first polygon-based wire to be converted into an object-based wire element;

analyzing edges of the polygon and determining corresponding edges that are parallel;

using information obtained from analyzing the edges of the polygon, creating a path that represents the polygon-based wire as a centerline and a width; and configuring an object-based wire element using the path as an attribute;

providing an unrecognized view including polyon-based shapes not yet recognized;

providing a recognized view including object-based wire elements that have been recognized; and removing geometries associated with the object-based wire element from the unrecognized view and adding the object-based wire element to the recognized view.

2. The method of claim 1, further including converting the path to a candidate polygon-based wire and checking if the candidate polygon-based wire substantially matches the first polygon-based wire.

3. The method of claim 1 further including comparing geometries of the object-based wire against geometries associated with the polygon-based layout.

4. The method of claim 3 including recognizing the object-based wire if the geometries of the object-based wire are fully contained within the geometries associated with the polygon-based layout.

5. The method of claim 4, including copying the object-based wire to a recognized view that contains other object-based devices.

6. The method of claim 1, wherein the object-based wire element encapsulates the geometric properties of the corresponding first polygon-based wire.

7. The method of claim 1, further including analyzing the first polygon-based wire including identifying vertices along a perimeter of the polygon-based wire and averaging corresponding vertices to obtain a centerline for the path.

8. The method of claim 1, wherein the creating step includes defining a sequence of centerline coordinates and a width.

9. The method of claim 1, wherein the polygon-based wire is damaged and further including repairing the polygon-based wire.

10. The method of claim 9, wherein the repairing step includes detecting an edge of the polygon-based wire that has geometry removed and removing vertices along the edge to repair the removed geometry.

11. The method of claim 9, wherein the repairing step includes detecting an end of the polygon-based wire that has geometry removed and moving vertices along the end to repair the removed geometry.

12. A method of converting a polygon-based wire to an object-based wire in an integrated circuit design, the method comprising:

(a) providing an unrecognized view including multiple layers of geometries associated with electrical devices that are not yet recognized;

(b) creating a recognized view for storing object-based wires associated with polygons from the unrecognized view;

(c) locating a first polygon associated with the unrecognized view;

(d) analyzing the first polygon to deduce a candidate path having a centerline and a width, the candidate path defining a single geometry independent of layers;

(e) converting the candidate path to a candidate polygon using the centerline and width obtained from the analyzing step;

(f) comparing the candidate polygon to the first polygon to determine if they are substantially equivalent;

(g) configuring an object-based wire using the candidate path, the wire including geometries on one or more layers (h) comparing the geometries on one of more layers of the wire against corresponding geometries associated with the first polygon; and (i) if the geometries of the wire are substantially contained within the geometries associated with the first polygon, copying the object-based wire into the recognized view and removing the geometries corresponding to the wire from the unrecognized view.

13. The method of claim 12, wherein the analyzing step includes:

(a) identifying vertices of the first polygon;

(b) identifying an end of the first polygon; and (c) averaging opposing vertices on the first polygon to obtain the centerline.

14. The method of claim 13, wherein the step of comparing the candidate polygon to the first polygon includes:

(a) identifying vertices of the candidate polygon; and (b) comparing the vertices of the candidate polygon to the vertices of the first polygon.

15. A method of converting a polygon-based wire to object-based wire in an integrated circuit design, the method comprising:

(a) providing an unrecognized view of polygons that are not yet recognized;

(b) creating a recognized view for storing object-based wires associated with polygons from the unrecognized view;

(c) locating a first polygon in the unrecognized view, the first polygon including multiple edges;

(d) applying a detection routine to the first polygon for detecting a damaged edge;

(e) applying a repair routine to repair the damaged edge; and (f) using the repaired, first polygon to recognize an object-based wire.

16. The method of claim 15 wherein the detection routine includes determining whether an edge is adjacent to recognized geometry.

17. The method of claim 15 wherein the detection routine includes determining whether two edges are parallel to each other.

18. The method of claim 15 wherein the repair routine includes removing vertices from the damaged edge.

19. The method of claim 15 further including partitioning a polygon representing multiple paths into sub-polygons and converting each sub-polygon into an independent, object-based wire.

20. A method of converting a polygon-based wire to an object-based wire in an integrated circuit design, the method comprising the steps of:

provinding a first polygon-based wire to be converted into an object-based wire element;

creating a path that represents the geometry on a primary layer of the polygon-based wire as a centerline and a width;

configuring an object-based wire element using the path as an attribute;

providing an unrecognized view including polygon-based shapes not yet recognized;

providing a recognized view including object-based wire elements that have been recognized; and removing geometries associated with the object-based wire element from the unrecognized view and adding the object-based wire element to the recognized view.

21. The method of claim 20, further including converting the path to a candidate polygon and checking if the candidate polygon substantially match a perimeter of a polygon on the primary layer of the first polygon-based wire.

22. The method of claim 20 comparing geometries of the object-based wire against geometries associated with the polygon-based layout.

23. The method of claim 22 including recognizing the object-based wire if the geometries of the object-based wire are fully contained within the geometries associated with the polygon-based layout.

24. The method of claim 23, including copying the object-based wire to a recognized view that contains other object-based devices.

25. The method of claim 20, wherein the object-based wire element encapsulates the geometric properties of the corresponding first polygon-based wire.

26. The method of claim 20, further including analyzing the first polygon-based wire including identifying vertices along a perimeter of the polygon-based wire and averaging corresponding vertices to obtain a centerline for the path.

27. The method of claim 20, wherein the creating step includes defining a sequence of centerline coordinates and a width.

28. The method of claim 20, further including repairing the polygon-based wire.

29. The method of claim 28, wherein the repairing step includes detecting an edge of the polygon-based wire that has geometry removed and removing vertices along the edge to repair the removed geometry.

30. A method of converting a polygon-based wire to an object-based wire in an integrated circuit design, comprising:

providing a wire represented as polygons to be converted to an object-based wire;

analyzing the edges of the polygons to deduce a path having a perimeter that substantially matches perimeters of the polygons, wherein the path can extend at any angles that are less than 90 degrees and greater than 0 degrees; and configuring an object-based wire element using the path as an attribute;

wherein the polygon-based wire is damaged and further including repairing the polygon-based wire by detecting an edge of the polygon-based wire that has geometry removed and moving vertices along the edge to repair the removed geometry.

31. The method of claim 30, wherein the object-based wire element may extend at all angles.

32. The method of claim 30, wherein the path can extend at all angles.

33. The method of claim 30 further including configuring a wire element using the path as an attribute, wherein the wire element takes on appropriate geometries on more than one layer.

34. The method of claim 30, wherein the wire element contains all geometries associated with the polygon-based wire.

35. A method of converting a polygon-based wire to an object-based wire in an integrated circuit design, the method comprising:

providing a first polygon-based wire to be converted into an object-based wire element;

analyzing edges of the polygon and determining corresponding edges that are parallel;

using information obtained from analyzing the edges of the polygon, creating a path that represents the polygon-based wire as a centerline and a width; and configuring an object-based wire element using the path as an attribute;

wherein the polygon-based wire is damaged and further including repairing the polygon-based wire.

36. The method of claim 35, wherein the repairing step includes detecting an edge of the polygon-based wire that has geometry removed and removing vertices along the edge to repair the removed geometry.

37. The method of claim 35, wherein the repairing step includes detecting an end of the polygon-based wire that has geometry removed and moving vertices along the end to repair the removed geometry.

* * * * *

UNITED STATES PATENT AND TRADEMARK OFFICE
CERTIFICATE OF CORRECTION

PATENT NO. : 6,167,555
DATED : December 26, 2000
INVENTOR(S) : John Stuart Lakos It is certified that error appears in the above-identified patent and that said Letters Patent is hereby corrected as shown below:

Column 2,
Line 9, change "to a path-based" to -- to path-based --.
Line 46, change "form" to -- form. --.

Column 3,
Line 43, change "computer," to -- computer. --.

Column 4,
Line 14, change "abject" to -- object --.

Column 5,
Line 11, change "1nt32Array" to -- Int32Array --.
Line 12, change "Elemid" to -- ElemId --.
Line 21, change "EDITABILE," to --EDITABLE, --.
Line 58, change "its," to -- its --.

Column 6,
Line 7, change "Linion" to -- Union --.
Line 15, change "to; objects" to -- to objects --.
Line 18, change "POLYGON-BASIED" to -- POLYGON-BASED --.
Line 40, change "also be specified" to -- also specified --.
Line 52, change "element to" to -- element is to --.
Line 54, change "contains" to -- contain --.

Column 7,
Line 61, change "a" to -- any --.

Column 8,
Line 18, change "as Path" to -- as a Path --.
Line 22, change "they" to -- them --.
Line 60, change "accomplished an" to -- accomplished in an --.

Column 9,
Line 47, change "array Other" to -- array. Other --

Column 10,
Line 18, change "is; more" to -- is more --.
Line 46, change "check," to -- checks --

UNITED STATES PATENT AND TRADEMARK OFFICE
CERTIFICATE OF CORRECTION

PATENT NO.    : 6,167,555
DATED         : December 26, 2000
INVENTOR(S)   : John Stuart Lakos It is certified that error appears in the above-identified patent and that said Letters Patent is hereby corrected as shown below:

Column 11,
Line 17, change "rep;airs" to -- repairs --.
Line 44, change "arid" to -- and --.
Line 62, change "10" to -- 10A --.

Column 12,
Line 9, change "trier" to -- tried --.
Line 10, change "illustrate" to -- illustrates --.
Line 42, change "solutions (best" to -- solutions [best --.

Column 13,
Line 17, change "lookup" to -- look up --.
Line 18, change "if" to -- If --.

Column 14,
Line 24, change "edgeweights" to -- edgeWeights --.

Column 16,
Line 19, change "layers" to -- layers; --.
Line 30, change "of" to -- or --.

Column 17,
Line 33, change "match" to -- matches --.

Signed and Sealed this

Twenty-sixth Day of February, 2002

Attest:

*Attesting Officer*

JAMES E. ROGAN
*Director of the United States Patent and Trademark Office*